(12) United States Patent
Kornely et al.

(10) Patent No.: US 9,421,500 B2
(45) Date of Patent: Aug. 23, 2016

(54) METHOD FOR PRODUCING A MICROSCREEN

(71) Applicant: SIEMENS AKTIENGESELLSCHAFT, Munich (DE)

(72) Inventors: Susanne Kornely, Munich (DE); Markus Schieber, Munich (DE); Daniel Sickert, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/770,294

(22) PCT Filed: Feb. 17, 2014

(86) PCT No.: PCT/EP2014/052985
§ 371 (c)(1),
(2) Date: Aug. 25, 2015

(87) PCT Pub. No.: WO2014/128068
PCT Pub. Date: Aug. 28, 2014

(65) Prior Publication Data
US 2016/0001231 A1    Jan. 7, 2016

(30) Foreign Application Priority Data

Feb. 25, 2013    (DE) .......... 10 2013 203 046

(51) Int. Cl.
*B01D 69/10* (2006.01)
*B01D 67/00* (2006.01)
*B01D 39/16* (2006.01)
*B01D 61/14* (2006.01)
*B01D 69/02* (2006.01)
*G03F 7/16* (2006.01)
*G03F 7/20* (2006.01)
*G03F 7/32* (2006.01)

(52) U.S. Cl.
CPC ........ *B01D 67/0034* (2013.01); *B01D 39/1692* (2013.01); *B01D 61/14* (2013.01); *B01D 69/02* (2013.01); *G03F 7/16* (2013.01); *G03F 7/20* (2013.01); *G03F 7/32* (2013.01); *B01D 2323/34* (2013.01); *B01D 2325/02* (2013.01)

(58) Field of Classification Search
CPC .......... G03F 7/16; G03F 7/20; G03F 7/2002; G03F 7/32; B01D 67/0034; B01D 61/14; B01D 2323/34; B01D 2323/345; B01D 2323/30; B01D 2325/02
USPC ........................................ 430/320
See application file for complete search history.

(56) References Cited

U.S. PATENT DOCUMENTS

| | | | |
|---|---|---|---|
| 3,880,763 | A | 4/1975 | Chapman et al. |
| 8,173,325 | B2 | 5/2012 | Takagi et al. |
| 2005/0266335 | A1 | 12/2005 | Johnson et al. |
| 2012/0138535 | A1 | 6/2012 | Gölzhäuser et al. |
| 2012/0183946 | A1 | 7/2012 | Tang et al. |
| 2014/0248429 | A1* | 9/2014 | Yang ................ B01D 67/0034 427/256 |

FOREIGN PATENT DOCUMENTS

| | | |
|---|---|---|
| DE | 2 301 553 | 7/1973 |
| DE | 112006000472 T5 | 4/2008 |
| DE | 102009034575 A1 | 1/2011 |
| DE | 10 2013 203 046.0 | 2/2013 |
| KR | 10-1215464 | 12/2012 |
| WO | 01/41905 A1 | 6/2001 |
| WO | 2011/139233 A1 | 11/2011 |
| WO | 2011/139445 A1 | 11/2011 |
| WO | 2013/049936 A1 | 4/2013 |
| WO | PCT/EP2014/052985 | 2/2014 |

OTHER PUBLICATIONS

Office Action for German Patent Application No. 10 2013 203 046.0, issued Jan. 29, 2014, 5 pages.
International Search Report for PCT/EP2014/052985, mailed on May 12, 2014, 3 pages.

* cited by examiner

*Primary Examiner* — John A McPherson
(74) *Attorney, Agent, or Firm* — Slayden Grubert Beard PLLC

(57) ABSTRACT

A method produces a microscreen by providing a support and applying a photoresist layer with a definable thickness to the support. The photoresist is exposed by radiation using a mask that defines the structure of the microscreen. The photoresist is then developed. The thickness of the photoresist layer is selected such that, in a sub-region of the photoresist layer, the radiation used for the exposure penetrates only so slightly that practically no cross-linking of the photoresist takes place.

8 Claims, 1 Drawing Sheet

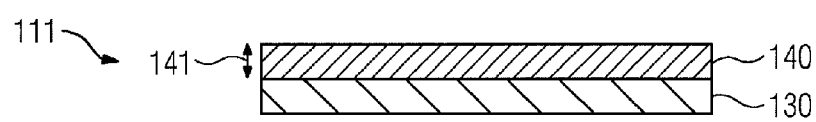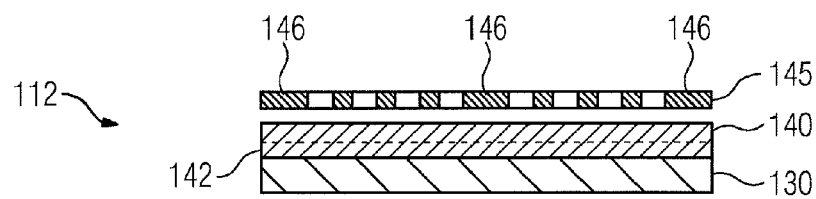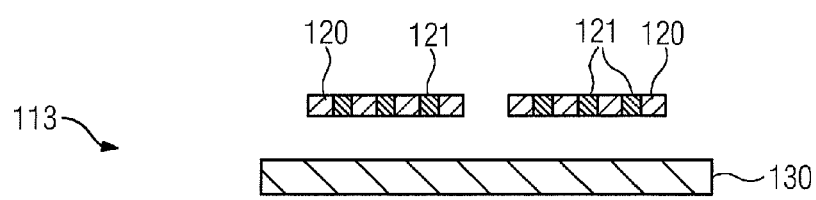

METHOD FOR PRODUCING A MICROSCREEN

CROSS REFERENCE TO RELATED APPLICATIONS

This application is based on and hereby claims priority to International Application No. PCT/EP2014/052985 filed on Feb. 17, 2014 and German Application No. 10 2013 203 046.0 filed on Feb. 25, 2013, the contents of which are hereby incorporated by reference.

BACKGROUND

The invention relates to a process for producing a microsieve.

For demanding separation tasks, for example in medical technology or biotechnology, microsieves are increasingly being used. For instance, the enrichment or extraction of particular cells from human blood can be effected by filtration of the blood through a microsieve (microfiltration). Microsieves, in contrast to the conventional microfilters made from sponge-like polymeric or ceramic membranes, have a defined pore geometry and are therefore much more efficient and have better classification.

For optimization of a filtration method, a freely selectable pore geometry and pore density and distribution of the microsieve are advantageous. In contrast to sponge-like filter membranes, the particles retained barely penetrate into the surface, if at all, in the case of microsieves. Thus, they are firstly more easily identifiable microscopically and secondly can be detached more easily from the filter if required by further analysis methods.

One type of known microsieves is that of the track-etched membranes. In the case of these, a polymer film is bombarded with heavy ions and the trace left behind in the film by the heavy ions is subsequently broadened by an etching operation to give a pore. As a result of the production process therefor, these membranes have a spatially irregular pore distribution. According to the pore size, the maximum number of pores per unit area is limited to a considerable degree. For example, it is only possible with track-etched membranes in the case of a pore diameter of 8 micrometers to achieve a pore fraction of the total area of the membrane of 5% at most. Moreover, a multitude of pores pass through the base material of the membrane not at right angles but obliquely. Furthermore, double pores occur, which together give rise to a common pore having a diameter greater than the nominal diameter.

WO 2011/139445 A1 discloses a method for producing microsieves, in which a photostructurable dry resist in the form of an epoxy resin film is structured by a photolithographic operation to give a microsieve. A disadvantage of the known process is that a separate detachment is always required for removal of the microsieve from the carrier used in the production, or alternatively a process in which the microsieve is undermined in subregions. WO 2011/139445 A1 especially proposes an etching step for this purpose, with which a copper carrier is removed from the microsieve.

SUMMARY

It is one possible object to specify an improved process for producing a microsieve.

The inventors propose a process for producing a microsieve, in which a photoresist layer having a definable thickness is applied to a carrier. In addition, exposure of the photoresist is undertaken using a mask, the mask defining the structure of the microsieve. Finally, development of the photoresist is undertaken.

In this case, the thickness of the photoresist layer is chosen such that the radiation used for exposure penetrates into a subregion of the photoresist layer only to such a minor degree that virtually no crosslinking of the photoresist takes place.

For the proposals, it was recognized that, in the case of negative photoresists, illumination through thick photoresist layers is subject to limits because of the absorption of the radiation used. One example of this is the resist of the AZ nLOF family: In the case of this photoresist, the light intensity at a wavelength of 365 nm after a resist layer thickness of 10 µm is already below 1% of the incident power. This intensity, even in the case of long exposure times, is insufficient for adequate crosslinking.

In the production of the microsieve, this effect is exploited: advantageously, the unexposed portion in the photoresist layer serves as sacrificial layer. In the development of the microsieve structures, the unexposed subregion of the photoresist layer is dissolved as well. As a result, the microsieve automatically becomes detached from the carrier used. Any additional process, for example etching, is unnecessary and can be dispensed with. The production or provision of a sacrificial layer which enables separation of the microsieve from the carrier is also unnecessary. In addition, photolithography operations are advantageously widespread and allow a high substrate throughput and hence inexpensive manufacture.

The mask is especially configured in such a way that the microsieve receives a hole structure, in which case the holes have a diameter, especially homogeneous diameter, between about 1 micrometer and 50 micrometers. In a particularly preferred configuration, the holes have a homogeneous diameter between 5 micrometers and about 25 micrometers, especially between about 7 micrometers and about 15 micrometers.

Preferably, the thickness chosen for the photoresist layer is at least the penetration depth of the radiation used for exposure, the penetration depth here referring to that depth in the photoresist at which the radiation intensity has been halved. More particularly, the thickness chosen for the photoresist layer may be at least twice the penetration depth.

It is advantageous when a photoresist having a low penetration depth is used, for example having a penetration depth of not more than 5 µm, especially not more than 1 µm.

The absolute thickness chosen for the photoresist layer is preferably a thickness between 1 µm and 20 µm, in a particular configuration a thickness between 1 µm and 5 µm.

In a further advantageous configuration of the process, the mask is configured such that an anchoring structure is produced after the development of the photoresist, the anchoring structure being configured such that the microsieve adheres to the carrier after the development. For this purpose, as well as the configuration of the mask, the development time chosen is appropriately sufficiently short that the anchoring structures do not become detached from the carrier.

In this case, the removal of the unexposed portion of the photoresist layer does not lead to complete detachment of the microsieve formed from the carrier. Instead, the predominant portion of the microsieve is formed in such a way that a separation between the microsieve and the carrier is assured.

The microsieves produced are usable, for example, for the analysis of what are called circulating tumor cells (CTCs). In this case, both the thickness of the microsieve and the diameter and periodicity of the pores also play a crucial role in the cell analysis. By the processes described, it is possible to produce microsieves for cell analysis in a suitable thickness and with a suitable pore diameter in an expensive and simple manner.

The microsieve thus obtained may especially be used for separation of solid substances and/or for retention of solid substances from a liquid and/or gas stream. A microsieve may thus generally also be understood to mean a microfilter element. The microsieve may especially be a (separating) membrane.

The microsieve may especially be used for enrichment or extraction of particular cells from cell-containing body fluids, for example from blood, urine, biopsy fluids, saliva, etc., including from human blood or from natural or synthetically created cell suspensions or dilutions thereof.

BRIEF DESCRIPTION OF THE DRAWINGS

These and other objects and advantages of the present invention will become more apparent and more readily appreciated from the following description of the preferred embodiments, taken in conjunction with the accompanying drawing of which:

The sole FIGURE shows a production process for production of a microsieve 120 having a defined pore distribution and defined pore geometries, which employs photolithography.

DETAILED DESCRIPTION OF THE PREFERRED EMBODIMENT

Reference will now be made in detail to the preferred embodiments of the present invention, examples of which are illustrated in the accompanying drawing, wherein like reference numerals refer to like elements throughout.

In 110, a carrier 130 is provided for the microsieve 120 to be produced. The carrier 130 is, for example, a silicon wafer or a glass plate. It is also possible to use other substantially smooth and particularly wafer-like carriers 130. The only prerequisite is that the carrier 130 is suitable, especially chemically stable, for photolithography.

In 111, a photoresist layer 140 is produced on the carrier. The photoresist layer 140 may be applied in known production variants, for example by spin-coating or spray application.

In this case, particular attention is paid to the ratio of the thickness 141 of the photoresist layer 140 and the optical density of the photoresist used. The thickness 141 is chosen to be sufficiently great that a subregion 142 of the photoresist layer 140 remains unexposed in the subsequent exposure process 112, or is exposed to such a minor degree that there is insufficient crosslinking in the photoresist. This achieves the effect that, on development, the subregion 142 of the photoresist layer 140 is removed together with the photoresist in the pores 121 of the microsieve 120. Thus, the entire photoresist which accounts for and brings about the connection to the carrier 130 is removed, such that the microsieve 120 becomes completely detached from the carrier 130. The thickness of the photoresist layer 140 in the FIGURE is shown in significantly exaggerated form relative to the thickness of the carrier 130.

For example, the photoresist used may be a material of the AZ® nLOF series. This material has such an optical density that the light to be used for the exposure penetrates a photoresist layer 140 having a thickness 141 of 10 μm only to an extent of about 1%. This results in a subregion 142 of several μm in thickness which has been insufficiently exposed. At the same time, the thickness of the subregion 142 is dependent on the thickness 141 of the photoresist layer 140 and the exposure time. If a comparatively high exposure time arises from the desired pore geometry or the desired thickness of the microsieve 120, the thickness 141 of the photoresist layer 140 can be increased, for example to 20 μm, in order again to obtain a sufficient subregion 142.

As is well known, the further processing of the photoresist layer 140 may be preceded by baking, for example at 110° C.

In 112, the exposure of the photoresist then takes place. For this purpose, the photoresist layer 140 is exposed to suitable radiation, for example radiation of wavelength 365 nm. A suitably configured mask 145 prevents exposure at those sites that are later to become pores 121 of the microsieve 120. In this case, it is possible to produce a single microsieve 120. Alternatively, it is also simultaneously possible to produce a composition composed of a multitude of microsieves 120. For this purpose, the mask 145 is configured suitably, for example by masking division regions 146 between the individual microsieves 120 to be produced in addition to the pores 121 to be produced with the mask 145.

The crosslinking of the photoresist that sets in 112 leads to formation of the actual microsieve structure. In order to assure a maximum accuracy of the microstructures to be produced, in other applications of photolithography, the thickness of the photoresist layer is not chosen to be excessively high compared to the penetration depth of the radiation into the photoresist. This forces crosslinking of the photoresist over the entire photoresist layer.

This is completely at odds with the present case, however, as already described, that the photoresist layer 140 chosen is thick compared to the penetration depth, such that there always remains a subregion 142 which is not sufficiently affected by the exposure. As a result, the subregion 142 automatically constitutes a sacrificial layer.

In 113, in a manner known per se, development of the photoresist takes place, for example with TMAH solution. The subregion 142 becomes detached together with the further unexposed portions of the photoresist layer 140. As a result, detachment of the microsieve 120 from the carrier 130 takes place automatically. The advantage of this process procedure is thus that no additional sacrificial layer is needed and the photoresist does not just serve to structure the microsieve 120 but is also simultaneously the material for the actual microsieve 120.

The microsieve structure thus obtained can subsequently be subjected to a further thermal treatment, for example for stabilization. In addition, the microsieve structure can be separated into smaller microsieves 120.

In a second working example, a microsieve 120 in which the end result is that the photoresist structure produced does not become fully detached from the carrier 130 is produced, and instead there remain anchoring structures, by which the microsieve 120 remains anchored on the carrier 130.

This exploits the fact that, in the development of the photoresist layer 140, the developer fluid can undermine the structures of the microsieve 120 only at a certain rate and hence cannot assure detachment of the photoresist layer 140 from the carrier 130 at the same rate everywhere.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. A process for producing a microsieve, comprising:
   providing a carrier;
   applying a photoresist layer to the carrier;
   exposing the photoresist layer to radiation using a mask to thereby selectively crosslink the photoresist layer, the mask defining a structure of the microsieve; and
   developing the photoresist,
   wherein the photoresist layer has a thickness on the carrier, such that a subregion of the photoresist layer is defined, the radiation used for exposure penetrating into the subregion of the photoresist layer only to such a minor degree that substantially no crosslinking takes place in the subregion of the photoresist layer,
   when developing the photoresist layer, at least one anchoring structure is produced, and
   the microsieve produced from the photoresist layer remains adhered to the carrier via the at least one anchoring structure, after the photoresist layer has been developed.

2. The process as claimed in claim 1, wherein
   a penetration depth of the radiation used for exposure is defined as a depth in the photoresist layer at which a radiation intensity has been halved, and
   the thickness of the photoresist layer is chosen to be at least as great as the penetration depth of the radiation used for exposure.

3. The process as claimed in claim 2, wherein the thickness of the photoresist layer is at least twice as great as the penetration depth of the radiation used for exposure.

4. The process as claimed in claim 1, wherein
   a penetration depth of the radiation used for exposure is defined as a depth in the photoresist layer at which a radiation intensity has been halved, and
   the photoresist layer is formed from a material and applied with a process such that the penetration depth is not more than 1 μm when the photoresist layer is exposed to the radiation.

5. The process as claimed in claim 1, wherein the thickness of the photoresist layer is between 1 μm and 20 μm.

6. The process as claimed in claim 1, wherein the thickness of the photoresist layer is between 1 μm and 5 μm.

7. The process as claimed in claim 1, wherein when developing the photoresist layer, a developer fluid does not undermine the subregion of the photoresist layer where the at least one anchoring structure is to be formed.

8. The process as claimed in claim 1, wherein the carrier is formed of a silicon wafer or a glass plate.

* * * * *